(12) United States Patent
Amick et al.

(10) Patent No.: US 6,614,275 B1
(45) Date of Patent: Sep. 2, 2003

(54) ADJUSTABLE CAPACITANCES FOR DLL LOOP AND POWER SUPPLY NOISE FILTERS

(75) Inventors: Brian Amick, Austin, TX (US); Claude Gauthier, Fremont, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/116,316

(22) Filed: Apr. 4, 2002

(51) Int. Cl.[7] ................................................ H03K 7/06
(52) U.S. Cl. ........................ 327/158; 327/283; 327/393; 327/401
(58) Field of Search ................................ 327/158, 159, 327/268, 283, 290, 337, 392, 393, 401, 554, 551–555

(56) References Cited

U.S. PATENT DOCUMENTS

| | | | | |
|---|---|---|---|---|
| 4,322,697 A | * | 3/1982 | Carbrey | 333/173 |
| 4,857,778 A | * | 8/1989 | Hague | 327/555 |
| 5,363,055 A | * | 11/1994 | Ribner | 330/9 |
| 5,416,436 A | * | 5/1995 | Rainard | 327/270 |
| 5,825,230 A | * | 10/1998 | Chen et al. | 327/337 |
| 5,936,439 A | * | 8/1999 | Pollersbeck | 327/110 |
| 5,982,213 A | * | 11/1999 | Schenck et al. | 327/276 |
| 6,094,102 A | * | 7/2000 | Chang et al. | 331/17 |
| 6,124,739 A | * | 9/2000 | Roither et al. | 327/100 |
| 6,133,803 A | * | 10/2000 | Bandou | 331/179 |

OTHER PUBLICATIONS

"Low–Jitter Process Independent DLL and PLL Based on Self–Biased Techniques" Author: John G. Maneatis As Published in: IEEE Journal of Solid–State Circuits, vol. 31, No. 11 Nov. 1996 (10 pages).

* cited by examiner

Primary Examiner—Timothy P. Callahan
Assistant Examiner—An T. Luu
(74) Attorney, Agent, or Firm—Rosenthal & Osha L.L.P.

(57) ABSTRACT

A delay locked loop having an adjustable capacitance stage is provided. The adjustable capacitance stage facilitates a selective post-silicon adjustment of capacitance amounts between a DLL loop filter capacitance and a power supply noise filter capacitance, thereby allowing a designer to reduce capacitance area space wastage and to obtain an optimal DLL performance level.

17 Claims, 6 Drawing Sheets

ADJUSTABLE CAPACITANCES FOR DLL LOOP AND POWER SUPPLY NOISE FILTERS

BACKGROUND OF INVENTION

To increase processor performance, clock frequencies used by microprocessors, often referred to as "CPUs", have increased. Also, as the number of circuits that can be used in a CPU has increased, the number of parallel operations has risen. Examples of efforts to create more parallel operations include increased pipeline depth and an increase in the number of functional units in super-scalar and very-long-instruction-word architectures. As processor performance continues to increase, the result has been a larger number of circuits switching at faster rates. Thus, from a design perspective, important considerations, such as power, switching noise, and signal integrity must be taken into account.

Higher frequencies for an increased number of circuits also increase switching noise on the power supply. If the components responsible for carrying out specific operations do not receive adequate power in a timely manner, computer system performance is susceptible to degradation. The switching noise may have a local or global effect. Circuits that create large amounts of noise may be relatively isolated; however, they may also affect other circuits, possibly involving very complex interactions between the noise generation and the function of affected circuits. Thus, providing power to the components in a computer system in a sufficient and timely manner has become an issue of significant importance.

As the frequencies of modern computers continue to increase, the need to rapidly transmit data between chip interfaces also increases. To accurately receive data, a clock is often sent to help recover the data. The clock determines when the data should be sampled by a receiver's circuits.

The clock may transition at the beginning of the time the data is valid. The receiver would prefer, however, to have a signal during the middle of the time the data is valid. Also, the transmission of the clock may degrade as it travels from its transmission point. In both circumstances, a delay locked loop, or DLL, can regenerate a copy of the clock signal at a fixed phase shift from the original.

Figure 1:
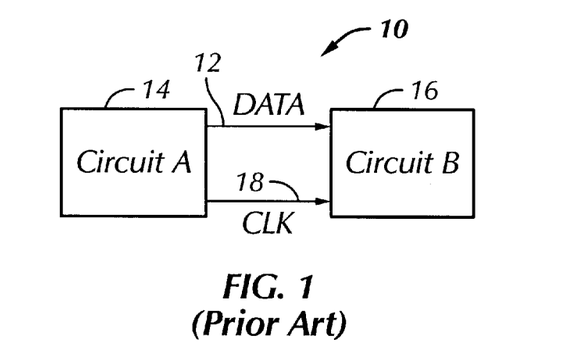
FIG. 1 shows a section of a typical computer system component.

FIG. 1 shows a section of a typical computer system component (10). Data (12) that is 'n' bits wide is transmitted from circuit A (14) to circuit B (16). To aid in the recovery of the transmitted data, a clock composed of a clock signal (18), or CLK, is also transmitted with the data. The circuits could also have a path to transmit data from circuit B (16) to circuit A (14) along with an additional clock (not shown). The clock signal (18) may transition from one state to another at the beginning of the data transmission. Circuit B (16) requires a signal temporally located some time after the beginning of the valid data. Furthermore, the clock signal (18) may have degraded during transmission. The DLL has the ability to regenerate the clock signal (18) to a valid state and to create a phase shifted version of the clock to be used by other circuits, for example, a receiver's sampling signal. The receiver's sampling signal determines when the input to the receiver should be sampled.

Delay locked loops are basically first order feedback control systems. As such, the delay locked loop can be described in the frequency domain as having a loop gain and a loop bandwidth. The loop bandwidth is the speed at which a signal completes the feedback loop of the delay locked loop to produce an update (i.e., error signal). Ideally, the DLL should have the highest possible bandwidth so that the clock and data track each other. In other words, the loop bandwidth of a DLL is typically desired to be high in order to be able to quickly correct errors introduced at an input of the DLL. Thus, the loop bandwidth of a DLL determines to a large degree what portion of input error is transmitted to an output of the DLL.

The loop bandwidth is dependent on a charge pump current and a loop filter capacitance. The more filter capacitance, the lower the loop bandwidth. For stability, i.e., a dominant single pole system, the loop bandwidth is set relatively low, which entails using a large loop filter capacitance. In addition, due to the considerable tolerances of the capacitors across process variations, additional capacitance is usually added to ensure that a DLL is stable. However, more capacitance than is actually needed typically ends up being present.

Another performance measure of a DLL, besides input error tracking, is jitter. Jitter is the time domain error from poor spectral purity of an output. In other words, the output plus a known phase shift, should track the input. In a repeated output pattern, such as a clock signal, jitter is present when a transition that occurs from one state to another that does not happen at the same time relative to other transitions is said to have jitter. Jitter is a direct result of power supply noise. The amount of power supply noise is related to the amount of capacitance on the power supply, i.e., the more power supply capacitance, the lower the power supply noise. However, after fabrication, due to the considerable tolerances of capacitors, capacitance may be much greater or less than had been designed for prior to fabrication. Also the amount of capacitance that can be placed on the power supply is often limited by area constraints. If the power supply capacitance is insufficient, a DLL's jitter performance can suffer, and hence, from a design perspective, maximum utilization of area to provide as much power supply noise filter capacitance as possible is necessary. Thus, after a DLL is fabricated, if it is found that the loop bandwidth is much lower than needed, a mask layer may be changed and re-fabricated to remove capacitance from the filter capacitance and add it to the power supply capacitance. In other cases, a designer may have planned ahead for high loop bandwidth, but ended up without enough capacitance for stability, in which case, the designer has to change a mask layer to add capacitance to the loop filter capacitance. Changing a mask layer is a costly and timely process. Thus, there is a need for a post-silicon, i.e., post-fabrication, capacitance adjustment technique to (1) allow the loop filter capacitance to be adjusted in order to find optimal stable loop bandwidth and (2) use unneeded loop filter capacitance for power supply noise filtering in order to reduce jitter. Such a technique would lead to optimal DLL performance.

SUMMARY OF INVENTION

According to one aspect of the present invention, an integrated circuit comprises: a voltage controlled delay stage responsive to a first signal applied at a first input thereof; and an adjustable capacitance stage comprising a first capacitance disposed between a power supply and the first input and a second capacitance disposed between the power supply and ground, where the first capacitance and the second capacitance are selectively adjustable.

According to another aspect, a delay locked loop adapted to connect to a power supply and ground comprises: a phase detector stage responsive to an input signal; a charge pump stage responsive to the phase detector stage, where the charge pump stage outputs a bias signal; a voltage controlled delay stage responsive to the bias signal; and an adjustable capacitance stage that is selectively controlled to adjust a first capacitance between the power supply and ground and a second capacitance between the power supply and the bias signal.

According to another aspect, an integrated circuit comprises: voltage delay means for delaying a signal, where the voltage delay means is responsive to a bias signal; and adjustable capacitance means for selectively adjusting a first capacitance disposed between a power supply and the bias signal and a second capacitance disposed between the power supply and ground.

According to another aspect, a method for post-silicon adjustment of a delay locked loop comprises: selectively positioning a first capacitance amount between a power supply and a bias signal of the delay locked loop, where the selective positioning of the first capacitance amount occurs by control of at least one switching device; selectively positioning a second capacitance amount between the power supply and ground; and operating the delay locked loop such that the first capacitance amount serves as a loop filter capacitance and the second capacitance amount serves as a power supply noise filter capacitance.

According to another aspect, a method for optimizing a delay locked loop comprises: forming an integrated circuit having a voltage controlled delay stage responsive to a first signal applied at a first input thereof and an adjustable capacitance stage having a first capacitance disposed between a power supply and the first input and a second capacitance disposed between the power supply and ground; and adjusting the first capacitance and the second capacitance to optimize the delay locked loop.

Other aspects and advantages of the invention will be apparent from the following description and the appended claims.

DETAILED DESCRIPTION

Figure 2A:
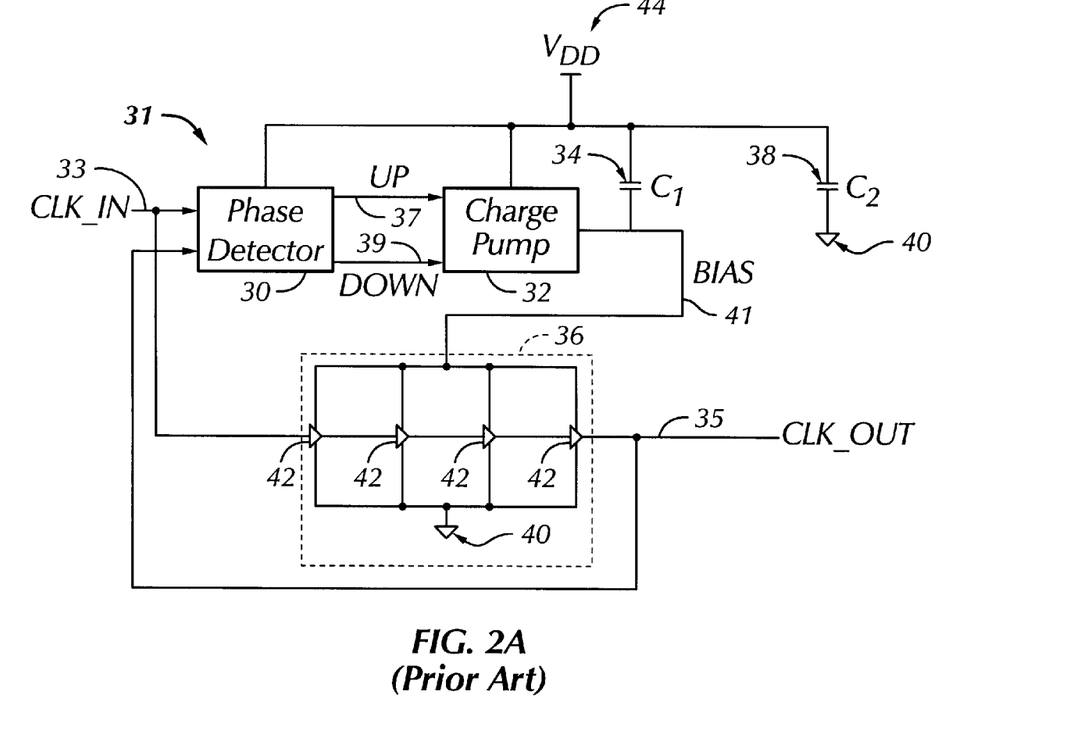
FIG. 2a shows a typical delay locked loop.

FIG. 2a shows a typical delay locked loop ("DLL") (31). The DLL (31) has input of CLK_IN (33) that is used to create a phased output. CLK_IN (33) is used as an input to a voltage controlled delay stage (36) and to a phase detector (30). The phase detector (30) measures whether a phase difference between CLK_IN (33) and an output (35) of the voltage controlled delay stage (36) is correct. In the case that the phase difference between CLK_IN (33) and the output (35) of the voltage controlled delay stage (36) needs to be adjusted, the phase detector (30) outputs UP (37) and/or DOWN (39) pulses to a charge pump (32). Depending on the UP (37) and DOWN (39) pulses, the charge pump (32) adds or removes charge from a loop filter capacitance $C_1$ (34), thereby changing a DC value of a BIAS signal (41), where BIAS (41) is used to control the delay of the voltage controlled delay stage (36). In other words, the charge pump (32) adjusts the voltage stored on loop filter capacitance $C_1$ (34) between BIAS (41) and a potential.

The voltage controlled delay stage (36) is implemented using one or more delay elements (42). The behavior of the delay elements (42) is controlled by modifying the amount of current available for charging and discharging capacitances within the delay elements (42) and/or by changing the capacitive load of one or more of the delay elements (42). The linearity of a voltage controlled delay stage's characteristics determines the stable range of frequencies over which the DLL (31) can operate. The output (35) from the voltage controlled delay stage (36) provides a phase delayed clock CLK_OUT to other circuits.

Still referring to FIG. 2a, the negative feedback in the DLL (31) adjusts the delay through the voltage controlled delay stage (36) by integrating the phase error that results between the periodic reference input, CLK_IN (33), and the voltage controlled delay stage output (35). When the DLL (31) is in lock, the voltage controlled delay stage (36) delays the reference input, CLK_IN (33), by a fixed amount of time to form the output (35) such that there is no detected phase error between the reference input, CLK_IN (33), and the output (35).

Figure 2B:
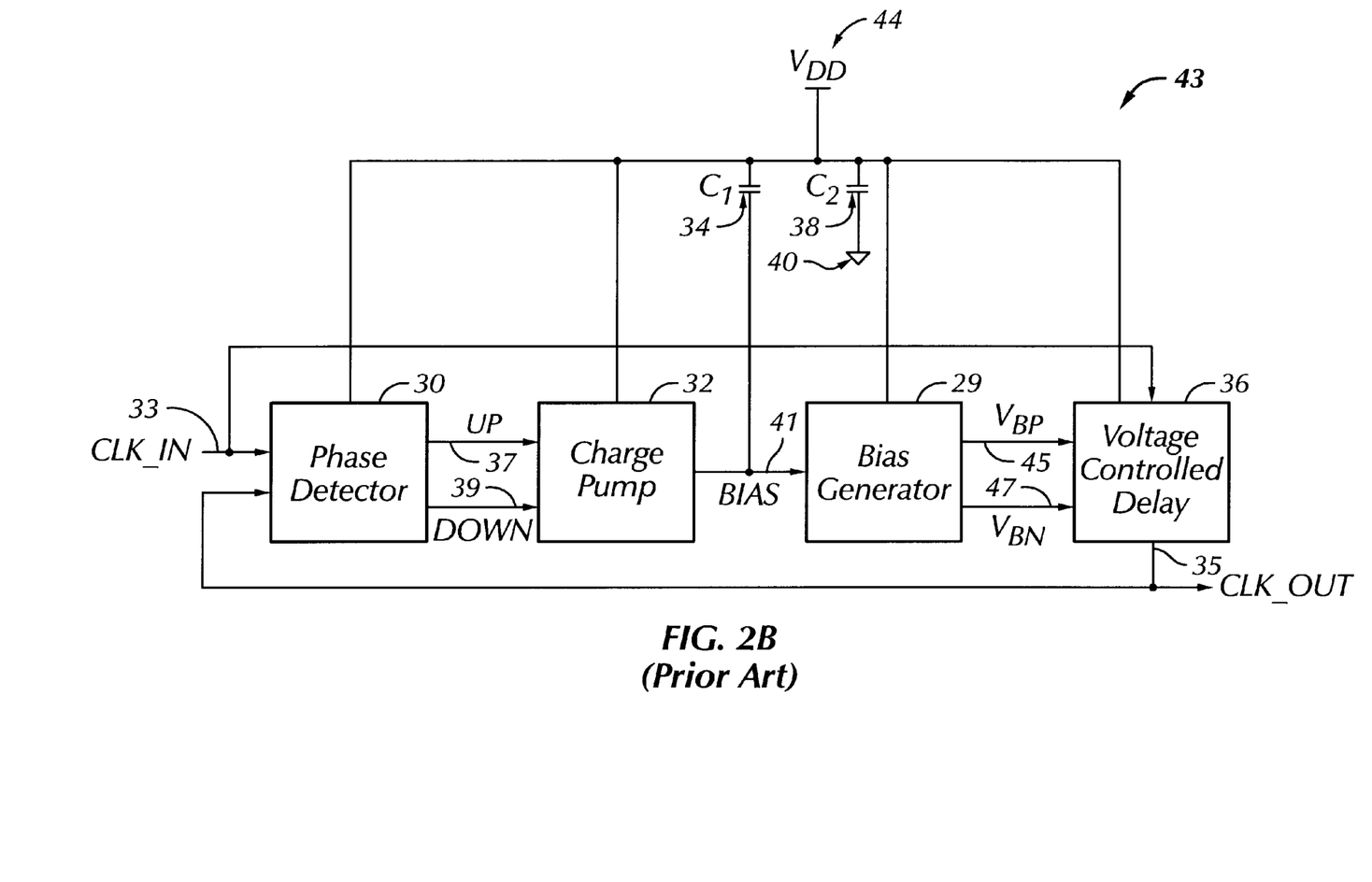
FIG. 2b shows another typical delay locked loop.

Now referring to FIG. 2b, another typical DLL (43) is shown. In addition to the elements used by the DLL (31) in FIG. 2a, the DLL (43) in FIG. 2b uses a bias generator (29) to control the voltage controlled delay stage (36). Here, the bias generator (29), depending on BIAS (41), produces signals $V_{BP}$ (45) and $V_{BN}$ (47) to the voltage controlled delay stage (36). The primary function of the bias generator (29) is to continuously adjust the current to the voltage controlled delay stage (36) in order to provide the correct lower swing limit of BIAS (41) for the voltage controlled delay stage (36). In so doing, the bias generator (29) establishes a current that is held constant and independent of supply voltage (44).

Now referring to both FIGS. 2a and 2b, by way of controlling the delay of voltage controlled delay stage (36), the loop filter capacitance $C_1$ (34) controls the bandwidth of the feedback loop. In order to reduce input tracking error in the DLL while maintaining stability, there should be a sufficient amount of filter capacitance between BIAS (41) and the supply voltage (44). However, as mentioned previously, because capacitors have high tolerances, capacitance amounts present after fabrication may vary greatly from amounts designed for prior to fabrication. Thus, in actual implementation, optimal bandwidth is often not realized.

Another factor leading to non-optimal DLL performance is power supply noise induced jitter. Thus, in order to reduce power supply noise induced jitter, a power supply noise filter capacitance (or decoupling capacitance) $C_2$ (38) is used. Unfortunately, the loop bandwidth is affected by many process technology factors and is generally constrained to levels below the lowest operating frequency for stability. For example, before a DLL is actually fabricated on a semiconductor, capacitance amounts for the loop filter capacitance $C_1$ (34) and power supply noise filter capacitance $C_2$ (38) are determined based on pre-silicon design. However, after fabrication, i.e., post-silicon, the predetermined capacitance amounts may not lead to optimal DLL performance (based on loop bandwidth and jitter measures) due to area limitations among the loop filter capacitance $C_1$ (34) and power supply noise filter capacitance $C_2$ (38). Further, such area constraints lead to unused capacitance after the DLL has been fabricated, which, in turn, causes a wastage of space. More significantly, due to poor DLL performance resulting from the area limitations among the loop filter capacitance $C_1$ (34) and power supply noise filter capacitance $C_2$ (38), a DLL may have an undesired and limited delay range.

Moreover, although the filter capacitance $C_2$ (38) is beneficial for filtering purposes, it adversely affects the loop bandwidth of the DLL. Thus, it would be beneficial to be able to allocate unneeded filter capacitance to power supply capacitance both in order to limit the restrictions on loop bandwidth induced by the unneeded filter capacitance and for reducing power supply noise induced jitter. However, because capacitance amounts are not exactly known until after fabrication, efficient capacitance distribution is not realized, which, in turn, leads to sub-optimal performance.

The present invention improves upon typical DLL designs by using an adjustable, i.e., controllable, capacitance stage. The adjustable capacitance stage allows a designer to selectively allocate capacitances involving a DLL after fabrication so as to allow the designer to determine an optimal point, i.e., highest loop bandwidth at which a DLL is stable, at which the lowest amount of output error is obtained. Accordingly, embodiments of the present invention relate to a DLL having an adjustable capacitance stage. Embodiments of the present invention further relate to a technique for controlling a DLL post-silicon to achieve an optimal amount of jitter and space efficiency.

Figure 3A:
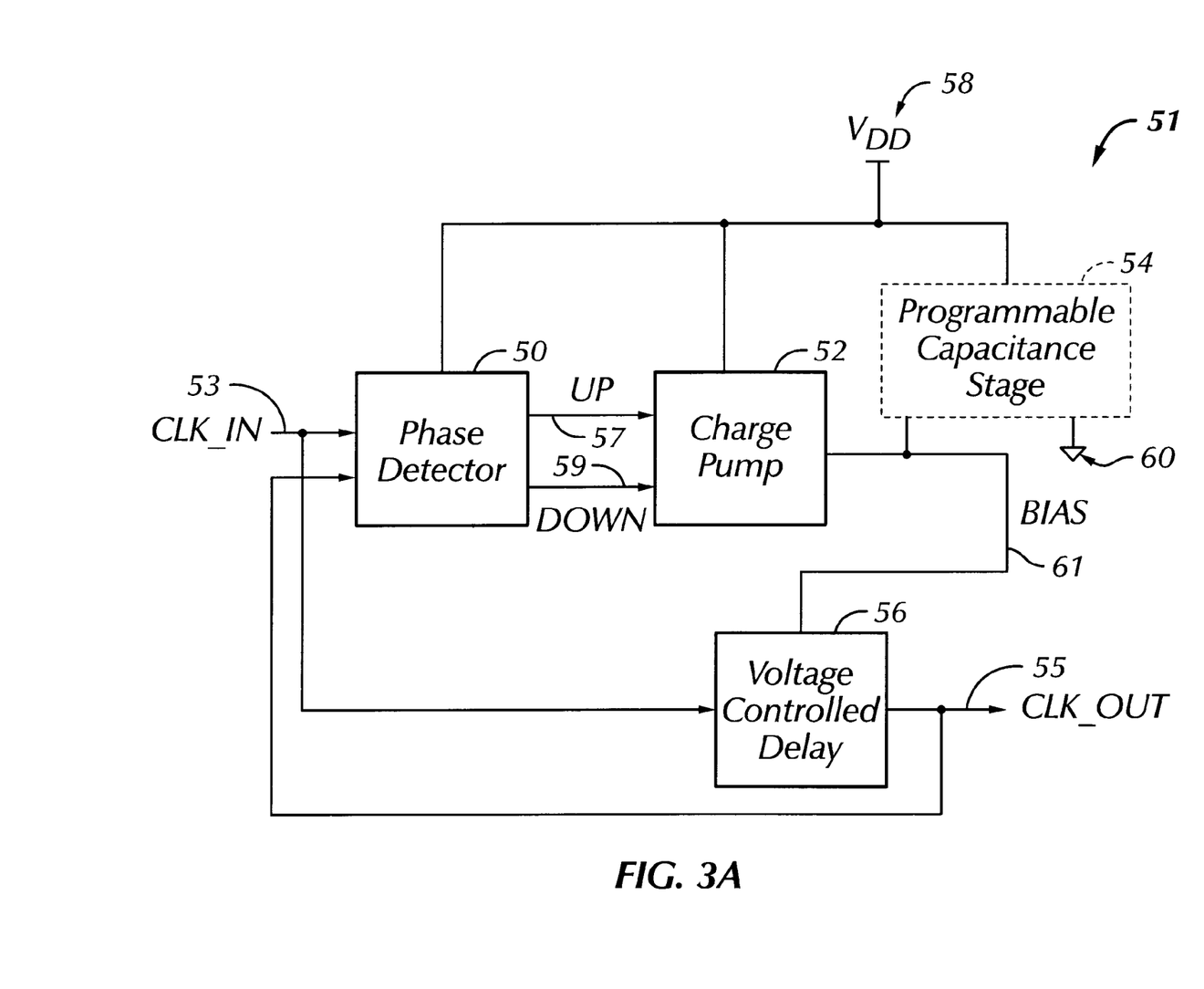
FIG. 3a shows a delay locked loop in accordance with an embodiment of the present invention.

FIG. 3a shows a DLL (51) in accordance with an embodiment of the present invention. In FIG. 3a, CLK_IN (53) is used as an input to a voltage controlled delay stage (56) and to a phase detector (50). The phase detector (50) measures whether a phase difference between CLK_IN (53) and an output (55) of the voltage controlled delay stage (56) is correct. In the case that the phase difference between CLK_IN (53) and the output (55) of the voltage controlled delay stage (56) needs to be adjusted, the phase detector (50) outputs UP (57) and/or DOWN (59) pulses to a charge pump (52). Depending on the UP (57) and DOWN (59) pulses, the charge pump (52) adds or removes charge from a pre-silicon amount of capacitance residing in an adjustable capacitance stage (54) (a discussion of the adjustable capacitance stage (54) is given below with reference to FIGS. 3c, 4a, 4b, and 4c), thereby changing a DC value of a BIAS signal (61), where BIAS (61) is used to control the delay of the voltage controlled delay stage (56). In other words, the charge pump (52) adjusts the voltage stored on the predetermined pre-silicon amount of capacitance residing in the adjustable capacitance stage (54) between BIAS (61) and a potential.

The voltage controlled delay stage (56) is implemented using one or more delay elements. The behavior of the delay elements is controlled by modifying the amount of current available for charging and discharging capacitances within the delay elements and/or by changing the capacitive load of one or more of the delay elements. The output (55) from the voltage controlled delay stage (56) provides a phase delayed clock CLK_OUT to other circuits.

Figure 3B:
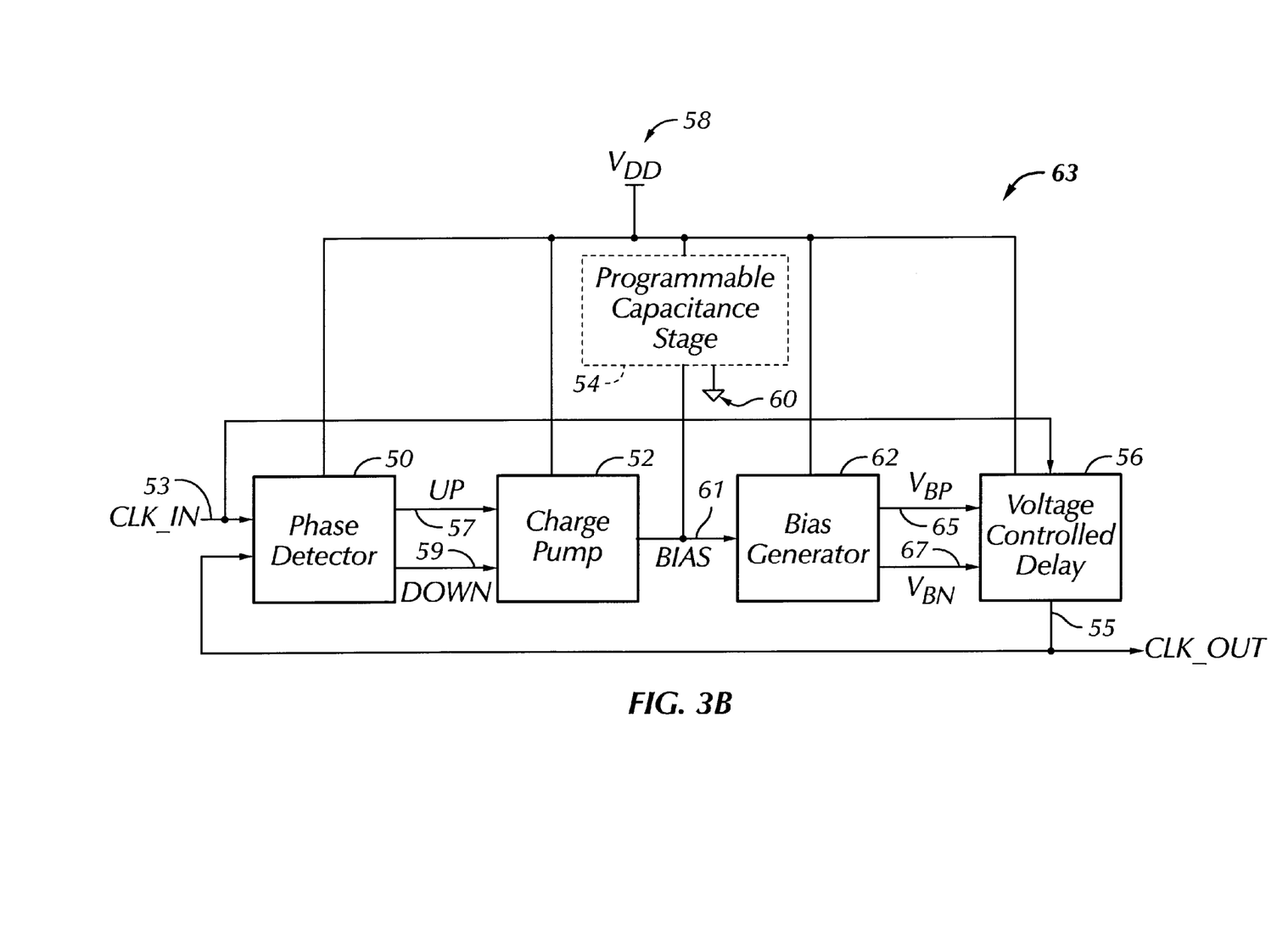
FIG. 3b shows a delay locked loop in accordance with another embodiment of the present invention.

Now referring to FIG. 3b, a DLL (63) in accordance with another embodiment of the present invention is shown. In addition to the elements used by the DLL (51) in FIG. 3a, the DLL (63) in FIG. 3b uses a bias generator (62) to control the voltage controlled delay stage (56). Here, the bias generator (62), depending on BIAS (61), produces signals $V_{BP}$ (65) and $V_{BN}$ (67) to the voltage controlled delay stage (56). As discussed above, the primary function of the bias generator (62) is to continuously adjust the current to the voltage controlled delay stage (56) in order to provide the correct lower swing limit of BIAS (61) for the voltage controlled delay stage (56). In so doing, the bias generator (62) establishes a current that is held constant and independent of supply voltage (58).

Now referring to both FIGS. 3a and 3b, by way of controlling the delay of voltage controlled delay stage (56), the pre-silicon loop filter capacitance amount controls the bandwidth of the feedback loop. In order to reduce input tracking error in the DLL while maintaining stability, there should be a sufficient amount of filter capacitance between BIAS (61) and the supply voltage (58). However, as mentioned previously, because capacitors have high tolerances, capacitance amounts present after fabrication may vary greatly from amounts designed for prior to fabrication. Thus, typically, in such a situation, the lowest amount of input tracking error is not achieved, and DLL performance suffers. However, because of the presence of an adjustable capacitance stage (54), the amount of capacitance allocated as loop filter capacitance for the DLL may be selectively adjusted after the DLL has been fabricated. Additionally, with the adjustable capacitance stage (54), an optimal amount of capacitance may be positioned between the power supply (58) and ground (60), thereby optimally reducing the amount of jitter caused from power supply noise.

Figure 3C:
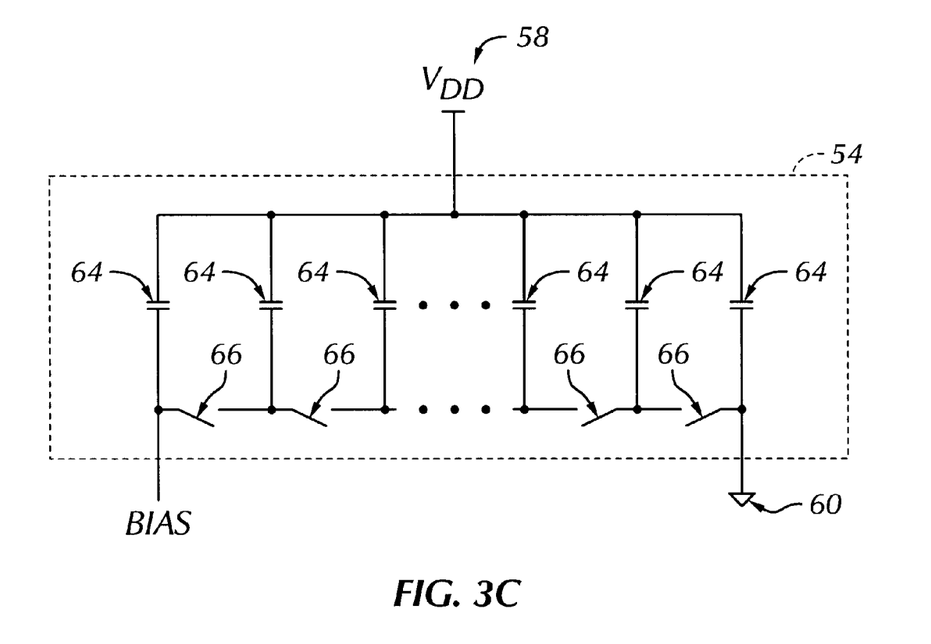
FIG. 3c shows an adjustable capacitance stage in accordance with an embodiment of the present invention.

FIG. 3c shows an adjustable capacitance stage (54) in accordance with an embodiment of the present invention. In FIG. 3c, a plurality of capacitances (64) having one terminal connected to the power supply (58) and another terminal connected to a series of switches (66) are shown. By controlling the states of the switches (66), a particular amount of capacitance may be allocated between the power supply (58) and BIAS and a particular amount of capacitance may be allocated between the power supply (58) and ground (60).

Thus, for example, a designer of a fabricated DLL may determine what amount of capacitance within a particular area needs to be positioned to adequately filter the power supply noise and then position the remaining capacitance to the loop filter capacitance. Alternatively, the designer may determine an optimal amount of loop filter capacitance and then allocate the remaining capacitance to filter the power supply noise. In another situation, the designer may selectively vary or tweak the amount of capacitance positioned for the loop filter capacitance and the power supply noise filter capacitance to determine an optimum area use of capacitance that leads to the lowest amount of input tracking error and/or space wastage. Those skilled in the art will appreciate that by allowing a designer to selectively determine capacitance utilization, 100% of the capacitance for the DLL may be utilized.

Further, those skilled in the art will appreciate that the capacitances (64) shown in FIG. 3c may have different values, thus providing added variability to the adjustable capacitance stage (54).

Further, those skilled in the art will appreciate that because higher bandwidth does not always lead to best overall performance, such a post-silicon adjustment design and technique allows a designer to optimize loop bandwidth while ensuring against capacitance wastage and minimizing jitter.

Figure 4A:
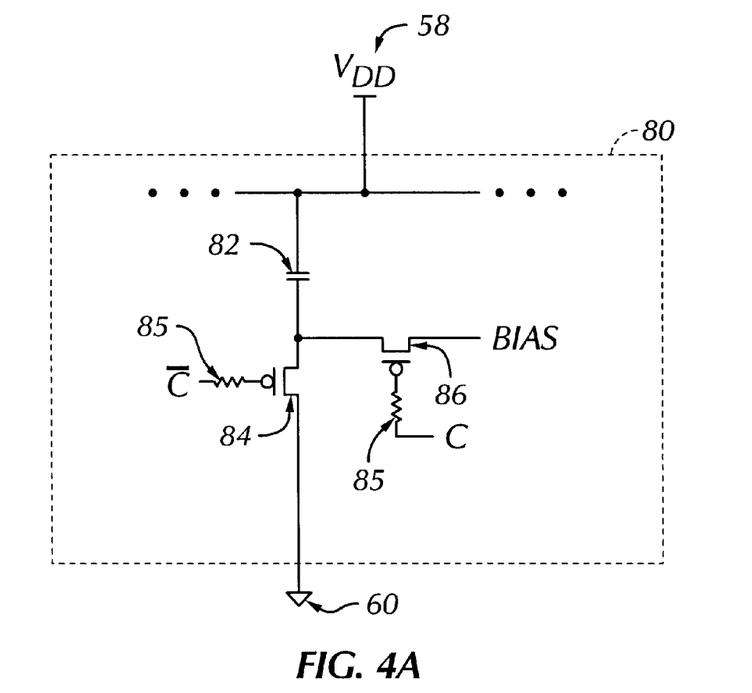
FIG. 4a shows a circuit schematic of an adjustable capacitance stage in accordance with an embodiment of the present invention.

FIG. 4a shows an adjustable capacitance stage (80) in accordance with an embodiment of the present invention. FIG. 4a shows an implementation of one capacitance-switch pair. Depending on a control signal, C, either a first switching device (84) or a second switching device (86) switches 'on.' If the first switching device (84) switches 'on,' then a capacitance (82) in the adjustable capacitance stage (80) gets positioned between the power supply (58) and ground (60). Alternatively, if the second switching device (86) switches 'on,' then the capacitance (82) gets positioned between the power supply (58) and BIAS. Further, resistances (85) are positioned in series with the gates of the first and second switching devices (84, 86) to prevent noise in the control signal from coupling through the parasitics of the first and second switching devices (84, 86). Thus, by controlling the control signal, the amount of capacitance used to filter power supply noise and as a DLL loop filter capacitance is adjustable so as to allow a designer to determine an optimal performance level for the DLL.

Those skilled in the art will understand that the adjustable capacitance stage (80) shown in FIG. 4a is not limited to one capacitance-switch pair and may contain any desired amount of capacitances (82) and switches (84, 86).

Figure 4B:
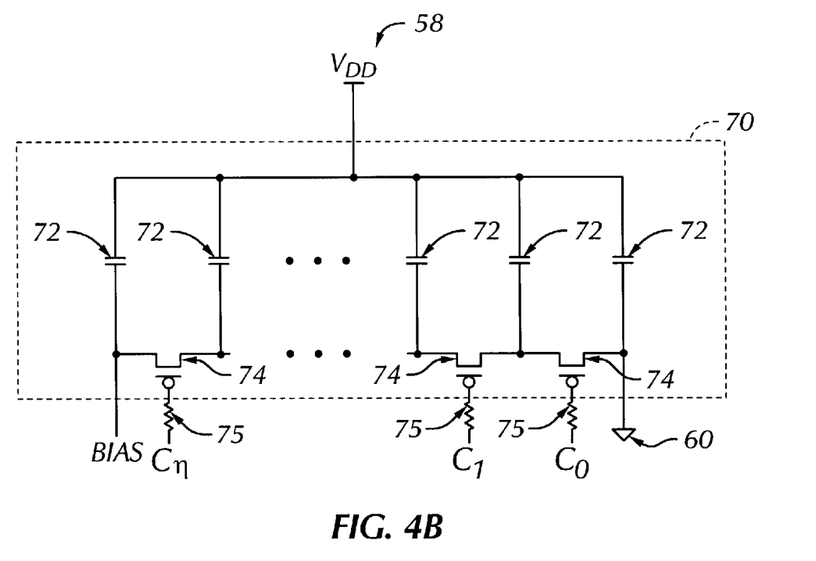
FIG. 4b shows a circuit schematic of an adjustable capacitance stage in accordance with another embodiment of the present invention.

FIG. 4b shows an adjustable capacitance stage (70) in accordance with another embodiment of the present invention. In FIG. 4b, switching devices (74) are positioned along a node connected to one set of terminals for a set of capacitances (72), where the other set of terminals for the set of capacitances (72) is connected to the power supply (58). Depending on one or more control signals $C_0, C_1, \ldots C_n$ (in the case of multiple control signals, a "control word" may be thought of as being used), the states of the switching devices (74) are controlled so as to allow for the selective allocation of capacitances between the power supply (58) and BIAS and between the power supply (58) and ground (60). Further, resistances (75) are positioned in series with the gates of the switching devices (74) to prevent noise in the control signals from coupling through the parasitics of the switching devices (74).

Figure 4C:
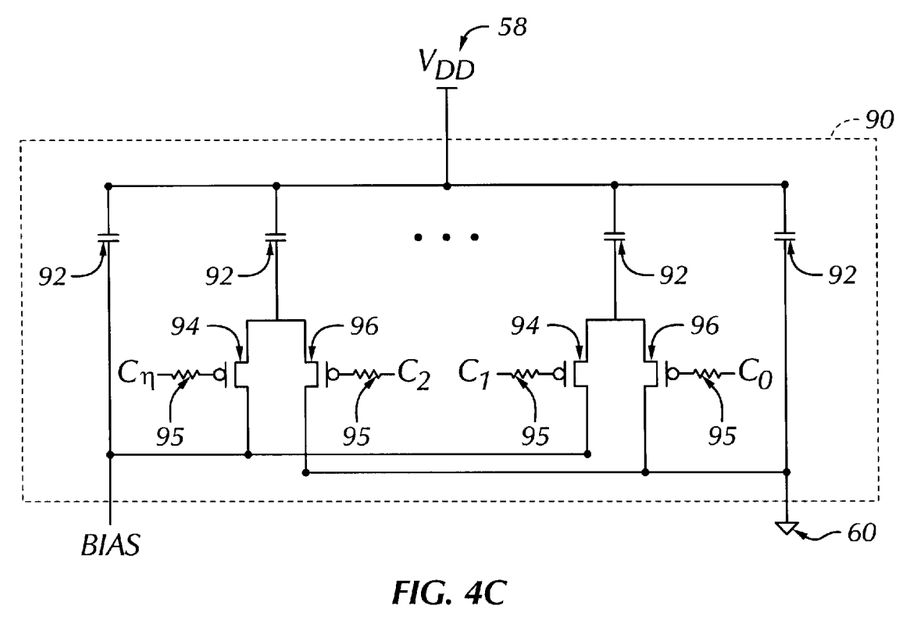
FIG. 4c shows a circuit schematic of an adjustable capacitance stage in accordance with another embodiment of the present invention.

FIG. 4c shows an adjustable capacitance stage (90) in accordance with another embodiment of the present invention. In FIG. 4c, switching devices (94, 96) are positioned in series with capacitances (92) such that the states of switching devices (94, 96) connected to a particular capacitance (92) determine whether a terminal of that particular capacitance (92) is connected to BIAS or ground (60), i.e., whether that particular capacitance (92) serves as a loop filter or a power supply noise filter. The states of the switching devices (94, 96) are controlled by a plurality of control signals $C_0, C_1, \ldots C_n$. Further, resistances (95) are positioned in series with the gates of the switching devices (94, 96) to prevent noise in the control signals from coupling through the parasitics of the switching devices (94, 96).

Those skilled in the art will appreciate that the various embodiments of an adjustable capacitance stage shown in FIGS. 4a, 4b, and 4c facilitate a post-silicon selective allocation/adjustment of capacitance, wherein switches in the adjustable capacitance stage are controlled by one or more control signals.

Advantages of the present invention may include one or more of the following. In some embodiments, because an amount of loop filter capacitance and power supply noise filter capacitance may be selectively allocated, an optimal use of capacitance leading to optimal DLL performance may be determined.

In some embodiments, because an amount of DLL loop filter capacitance and power supply noise filter capacitance may be selectively adjusted after the DLL has been fabricated, optimal loop bandwidth may be realized, thereby increasing DLL performance.

In some embodiments, because an amount of loop filter capacitance and power supply noise filter capacitance may be selectively adjusted after a DLL has been fabricated, a use of capacitance leading to minimal space wastage may be achieved.

In some embodiments, because an amount of DLL loop filter capacitance and power supply noise filter capacitance may be selectively adjusted after the DLL has been fabricated, jitter may be minimized, thereby optimizing DLL performance.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated circuit, comprising:
   a voltage controlled delay stage responsive to a first signal applied at a first input thereof; and
   an adjustable capacitance stage comprising:
      a capacitance having a first terminal connected to a power supply, and
      a switching device responsive to a control signal, wherein the switching device, based on the control signal, connects a second terminal of the capacitance to one of the first input and ground.

2. The integrated circuit of claim 1, wherein the switching device is a metal-oxide semiconductor device.

3. The integrated circuit of claim 1, further comprising a resistance connected in series with a gate of the switching device.

4. A delay locked loop adapted to connect to a power supply and ground, comprising:
   a phase detector stage responsive to an input signal;
   a charge pump stage responsive to the phase detector stage, wherein the charge pump stage outputs a bias signal;
   a voltage controlled delay stage responsive to the bias signal; and
   an adjustable capacitance stage comprising:
      a first capacitance having a first terminal connected to the power supply, and
      a switching device responsive to a control signal, wherein the switching device, based on the control signal, connects a second terminal of the first capacitance to one of the bias signal and ground.

5. The delay locked loop of claim 4, wherein the first capacitance is a loop filter capacitance of the delay locked loop.

6. The delay locked loop of claim 4, further comprising a second capacitance disposed between the power supply and ground, wherein the second capacitance is a power supply noise filter capacitance.

7. The delay locked loop of claim 4, wherein an output of the voltage controlled delay stage represents an output of the delay locked loop.

8. The delay locked loop of claim 7, wherein the phase detector stage inputs the output from the voltage controlled delay stage.

9. The delay locked loop of claim 4, further comprising:
a bias generator stage responsive to the bias signal, wherein the bias generator stage outputs to the voltage controlled delay stage.

10. The delay locked loop of claim 4, wherein the switching device is a metal-oxide semiconductor device.

11. The delay locked loop of claim 4, further comprising a resistance connected in series with a gate of the switching device.

12. The delay locked loop of claim 4, wherein the adjustable capacitance stage is selectively controlled after the delay locked loop has been fabricated in an integrated circuit.

13. An integrated circuit, comprising:
voltage delay means for delaying a signal, wherein the voltage delay means is responsive to a bias signal; and
adjustable capacitance means for selectively connecting a terminal of a capacitance to one of the bias signal and ground.

14. A method for post-silicon adjustment of a delay locked loop, comprising:
selectively positioning a first capacitance amount between a power supply and a bias signal of the delay locked loop, wherein the selectively positioning comprises:
connecting a terminal of the first capacitance amount to one of the bias signal and ground dependent on a control signal;
selectively positioning a second capacitance amount between the power supply and ground; and
operating the delay locked loop such that the first capacitance amount serves as a loop filter capacitance and the second capacitance amount serves as a power supply noise filter capacitance.

15. The method of claim 14, further comprising:
controlling a voltage controlled delay stage of the delayed locked loop using the bias signal;
phase comparing an output of the voltage controlled delay stage to a reference input to the delay locked loop; and
adjusting an amount of charge on the bias signal based on the phase comparison of the output of the voltage controlled delay stage and the reference input.

16. The method of claim 14, further comprising:
generating differential bias signals to the voltage controlled delay stage based on the bias signal.

17. A method for optimizing a delay locked loop, comprising:
forming an integrated circuit comprising:
a voltage controlled delay stage responsive to a first signal applied at a first input thereof; and
an adjustable capacitance stage comprising a capacitance having a first terminal connected to a power supply; and
selectively connecting a second terminal of the capacitance to one of the first signal and ground dependent on a control signal to the a adjustable capacitance stage.

* * * * *

UNITED STATES PATENT AND TRADEMARK OFFICE
CERTIFICATE OF CORRECTION

PATENT NO.    : 6,614,275 B1                                                Page 1 of 1
DATED         : September 2, 2003
INVENTOR(S)   : Brian Amick et al.

It is certified that error appears in the above-identified patent and that said Letters Patent is hereby corrected as shown below:

<u>Column 10,</u>
Line 28, delete "a" before "adjustable".

Signed and Sealed this

Fourth Day of November, 2003

JAMES E. ROGAN
*Director of the United States Patent and Trademark Office*